United States Patent
Nishioka et al.

(10) Patent No.: US 12,469,671 B2
(45) Date of Patent: Nov. 11, 2025

(54) STAGE APPARATUS AND CHARGED PARTICLE BEAM APPARATUS INCLUDING STAGE APPARATUS

(71) Applicant: Hitachi High-Tech Corporation, Tokyo (JP)

(72) Inventors: Akira Nishioka, Tokyo (JP); Motohiro Takahashi, Tokyo (JP); Masaki Mizuochi, Tokyo (JP); Yasuhiro Ando, Tokyo (JP); Raifu Yamamoto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 452 days.

(21) Appl. No.: 17/963,723

(22) Filed: Oct. 11, 2022

(65) Prior Publication Data
US 2023/0143197 A1     May 11, 2023

(30) Foreign Application Priority Data
Nov. 8, 2021   (JP) ................. 2021-181598

(51) Int. Cl.
*H01J 37/20*   (2006.01)
*H01J 37/26*   (2006.01)
*H01J 37/30*   (2006.01)

(52) U.S. Cl.
CPC ............. *H01J 37/20* (2013.01); *H01J 37/26* (2013.01); *H01J 37/3007* (2013.01); *H01J 2237/002* (2013.01); *H01J 2237/2007* (2013.01)

(58) Field of Classification Search
CPC ........ H01J 37/20; H01J 37/26; H01J 37/3007; H01J 2237/002; H01J 2237/0022; H01J 2237/2001; H01J 2237/2007
See application file for complete search history.

(56) References Cited

U.S. PATENT DOCUMENTS

| | | | |
|---|---|---|---|
| 5,684,856 A * | 11/1997 | Itoh | G03F 7/70716 378/208 |
| 2005/0007575 A1* | 1/2005 | Miyajima | G03F 7/70716 355/75 |
| 2015/0029484 A1* | 1/2015 | Kii | G03F 7/70 355/72 |

FOREIGN PATENT DOCUMENTS

| | | | |
|---|---|---|---|
| JP | 2001-61269 A | 3/2001 | |
| JP | 2005-32817 A | 2/2005 | |
| JP | 2005-64229 A | 3/2005 | |
| WO | WO-2016093185 A1 * | 6/2016 | G03F 7/20 |

* cited by examiner

*Primary Examiner* — David E Smith
(74) *Attorney, Agent, or Firm* — Volpe Koenig

(57) ABSTRACT

A stage apparatus includes a lower stage that moves in a Y-axis direction, an upper stage that floats from the lower stage and moves at least in an X-axis direction orthogonal to the Y-axis direction, a heat exchanger that cools a Y table of the lower stage with a refrigerant, and a control device that controls an inclination of the lower stage with reference to the Y table cooled by the heat exchanger.

14 Claims, 5 Drawing Sheets

STAGE APPARATUS AND CHARGED PARTICLE BEAM APPARATUS INCLUDING STAGE APPARATUS

BACKGROUND OF THE INVENTION

1. Field of the Invention

The present invention relates to a stage apparatus and a charged particle beam apparatus including the stage apparatus.

2. Description of the Related Art

In the field related to semiconductors, a stage apparatus for moving and accurately positioning a sample such as a semiconductor wafer is known. In an apparatus that handles charged particle beams such as electron beams, it is necessary to handle a sample such as a semiconductor wafer in a high vacuum environment, and the stage apparatus is also operated in a high vacuum environment.

The structure of the stage apparatus is classified into a guide rail type stage that is limited to movement only in a direction along the guide rail and is mechanically prohibited from moving in the other direction, and a floating type stage that floats from the base portion and moves by control in a non-contact state with the base portion. In order to realize planar movement in the guide rail type stage, the upper stage may be moved in a direction orthogonal to the moving direction of the lower stage as a stage configuration of two upper and lower stages. On the other hand, the floating stage includes a uniaxial operation type having a large movable range only in one direction and having a narrow movable range with respect to the other direction, and a planar operation type capable of moving widely in a planar manner. It is also possible to configure a stage that operates planarly by combining a single-axis operation type floating type stage and a guide rail type stage. Further, as a floating mechanism of the floating stage, there are a magnetic floating type that controls a floating amount using electromagnetic force and an air bearing type that controls a floating amount using pressure of gas.

The magnetic floating type stage is classified into a type having an electromagnet that gives buoyancy to the stage and a linear motor that gives thrust in a uniaxial direction, and a type having a shaft motor capable of performing both functions of floating and propulsion as one. In both types, the stage is movable while maintaining a non-contact state. In the non-contact state, a mechanical stabilization mechanism cannot be obtained, but there is a possibility that high positional accuracy of the stage can be realized by advanced control of the floating stage.

When the floating stage is placed in a vacuum environment, heat generated by a motor that drives the stage cannot be released by solid heat conduction, so that a heat dissipation means using a refrigerant is required. For example, JP 2005-32817 A discloses a technique of cooling a drive unit inside a fine movement stage that moves a wafer with a refrigerant. JP 2001-61269 A discloses a technique for cooling a coil of a motor with a refrigerant in a stage apparatus that moves a substrate table on which a wafer is placed using a shaft motor. Further, JP 2005-64229 A discloses a technique related to a cooling device that cools a linear motor that moves a wafer stage on which a wafer is placed.

SUMMARY OF THE INVENTION

In processes such as semiconductor wafer manufacturing, measurement, and inspection, the wafer needs to be accurately positioned. In order to accurately position the semiconductor wafer, it is necessary to accurately grasp the position of the stage on which the wafer is moved. As a technique for accurately measuring the position of the stage, there is a technique using a laser interferometer type distance measuring device in which a mirror bar is installed on the stage, laser beam is applied to a reflecting surface of the mirror bar, and distance measurement is performed using interference between incident light and reflected light. In a recent laser interferometer type distance measuring device, distance measurement can be performed with accuracy on the order of picometers. If the distance measurement can be performed with the accuracy of the order, it seems that sufficient positional accuracy of the wafer can be obtained practically. However, in practice, various error factors that deteriorate the positional accuracy of the wafer are combined in the floating stage, so that it is difficult to ensure sufficient positional accuracy of the wafer.

Therefore, the present invention provides a technique for ensuring sufficient positional accuracy of a sample in a floating stage.

A stage apparatus according to the present invention includes: a first stage configured to move in a first direction; a second stage configured to float from the first stage and move in a second direction orthogonal to at least the first direction; a first cooling unit configured to cool the table of the first stage with a refrigerant; and a control device configured to control an inclination of the second stage with reference to the table of the first stage cooled by the first cooling unit.

According to the present invention, it is possible to ensure sufficient positional accuracy of the sample in the floating stage.

DESCRIPTION OF THE PREFERRED EMBODIMENTS

Embodiments of the present invention will be described on the basis of the drawings. In the following embodiments, it is needless to say that the components (including element steps and the like) are not necessarily essential unless otherwise specified and considered to be essential in principle.

First Embodiment

Figure 1:
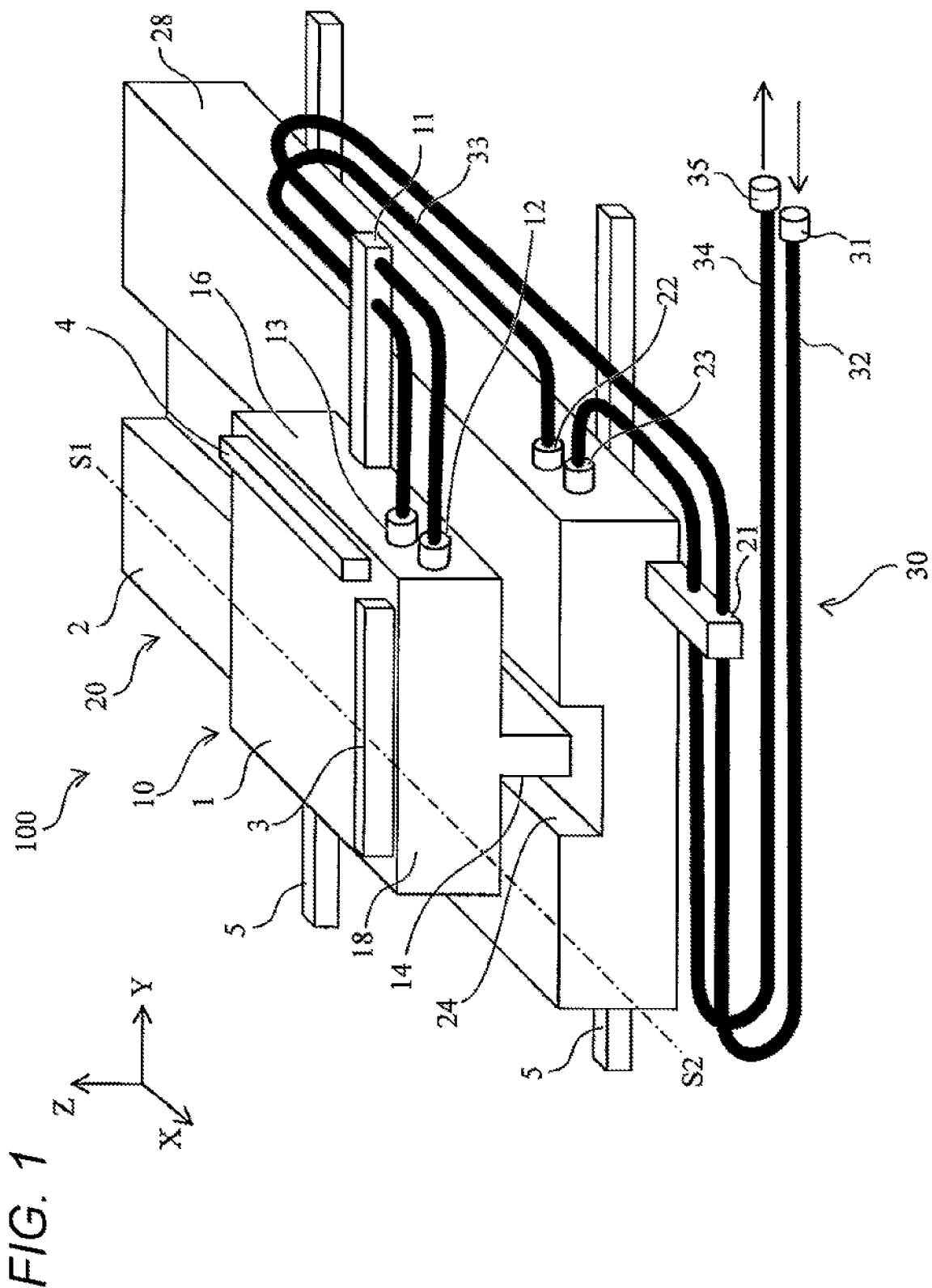
FIG. 1 is a diagram illustrating an overall configuration of a stage apparatus of a first embodiment.
Figure 2:
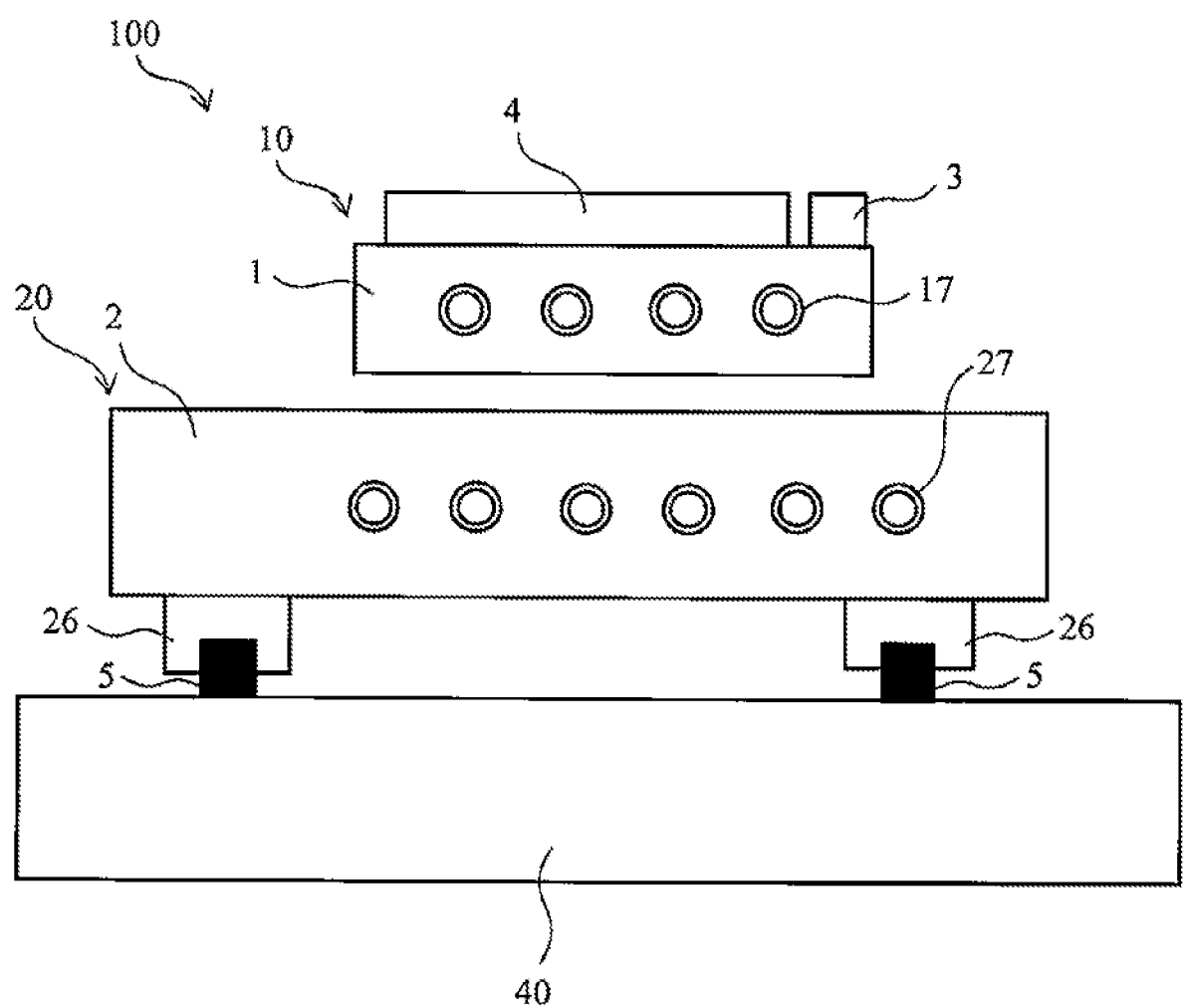
FIG. 2 is a cross-sectional view of the stage apparatus according to the first embodiment.

FIG. 1 is a diagram illustrating an overall configuration of a stage apparatus according to a first embodiment. FIG. 2 is a cross-sectional view of the stage apparatus according to the first embodiment. A stage apparatus 100 of the first embodiment is an apparatus that moves a placed sample (for example, a semiconductor wafer) in the X-axis direction and the Y-axis direction. The stage apparatus 100 includes an upper stage 10 that moves in the X-axis direction, a lower stage 20 that moves in the Y-axis direction, a cooling water pipe 30 that supplies cooling water for cooling the upper stage 10 and the lower stage 20, and a control device 50 (see FIG. 3). The upper stage 10 floats from the lower stage 20 by magnetic force with the lower stage 20, and moves at least in the X-axis direction orthogonal to the Y-axis direction.

(Upper Stage 10)

The upper stage 10 is configured around an X table 1. The upper stage 10 floats from a Y table 2 of the lower stage 20 and moves in the X-axis direction relative to the lower stage 20. The upper stage 10 mainly moves in the X-axis direction, and the moving direction includes a deviation of about an error with respect to the X-axis direction. The upper stage 10 may move not only in the X-axis direction but also in a planar manner. Various mechanisms such as a mechanism for floating the upper stage 10 from the Y table 2, a mechanism for moving the upper stage 10 in the X-axis direction, and a mechanism for moving the upper stage 10 in the Y-axis direction are attached to the upper stage 10. These various mechanisms are provided inside the X table 1. These various mechanisms serve as heat sources and conduct heat to the X table 1.

An X mirror 3 which is a mirror bar for measuring an X coordinate and a Y mirror 4 which is a mirror bar for measuring a Y coordinate are fixed on the X table 1. The X mirror 3 has a reflecting surface perpendicular to the X axis, and reflects a laser beam emitted from a laser interferometer type distance measuring device (not illustrated). The Y mirror 4 has a reflecting surface perpendicular to the Y axis, and reflects a laser beam emitted from a laser interferometer type distance measuring device (not illustrated). This makes it possible to measure the X coordinate of the reflecting surface of the X mirror 3 and the Y coordinate of the reflecting surface of the Y mirror 4. By measuring the X coordinate and the Y coordinate of the reflecting surface, the XY coordinates of the X table 1 to which the X mirror 3 and the Y mirror 4 are fixed and the XY coordinates of the sample placed on the X table 1 are calculated.

(Lower Stage 20)

The lower stage 20 is configured around the Y table 2. The lower stage 20 moves in the Y-axis direction. The lower stage 20 mainly moves in the Y-axis direction, but its moving direction includes a deviation of about an error with respect to the Y-axis direction. The lower stage 20 may move not only in the Y-axis direction but also in a planar manner. The lower stage 20 moves in the Y-axis direction on two guide rails 5 arranged along the Y-axis direction. The lower stage 20 is restrained by the two guide rails 5 so as not to be movable in a direction other than the Y-axis direction. The lower stage 20 of the first embodiment is a guide rail type, but may be a floating type stage. The lower stage 20 has various mechanisms such as a mechanism for floating the upper stage 10 from the Y table 2 and a mechanism for moving the lower stage 20 in the Y-axis direction. These various mechanisms are provided inside the Y table 2. These various mechanisms serve as heat sources and conduct heat to the Y table 2.

(Cooling Water Pipe 30)

The stage apparatus 100 may be used in a sample chamber in which a sample such as a semiconductor wafer is manufactured, measured, or inspected. In an apparatus that handles charged particle beams such as electron beams, it is necessary to handle a sample such as a semiconductor wafer in a high vacuum environment, and the stage apparatus 100 also operates in the high vacuum environment. It is necessary to cool the upper stage 10 and the lower stage 20 in order to suppress malfunction, thermal expansion, and the like due to heat generation of the mechanism that moves the upper stage 10 and the lower stage 20. In the first embodiment, the stage apparatus 100 includes the cooling water pipe 30 that supplies a refrigerant to the upper stage 10 and the lower stage 20 in order to cool the upper stage 10 and the lower stage 20. In the first embodiment, cooling water is used as the refrigerant. As a method of cooling the stage apparatus 100, water cooling, air cooling, gas cooling, or the like can be adopted.

The cooling water supplied from a thermostatic water bath (not illustrated) is supplied to both the upper stage 10 and the lower stage 20 via the cooling water pipe 30. The cooling water pipe 30 includes a joint 31, an outgoing pipe 32, a transition pipe 33, a return pipe 34, and a joint 35. The thermostatic water bath supplies cooling water to the outgoing pipe 32 connected to the joint 31. The outgoing pipe 32 is connected to a heat exchanger 17 (see FIG. 2) provided inside the X table 1 of the upper stage 10. The outgoing pipe 32 is disposed along the Y-axis direction from the joint 31, turns in a U shape, and then disposed along the Y-axis direction. The outgoing pipe 32 disposed along the Y-axis direction is supported by a support 21 provided in the lower stage 20. As described above, by turning the outgoing pipe 32 in the U shape, the portion turned in the U shape is displaced following the movement of the lower stage 20 in the Y-axis direction. Therefore, a material that can be flexibly bent, such as a resin tube, is used for the cooling water pipe 30.

The outgoing pipe 32 that has passed the support 21 is disposed along the X-axis direction, turns in a U shape, and then disposed along the X-axis direction. The outgoing pipe 32 disposed along the X-axis direction is supported by a support 11 provided on the upper stage 10. As described above, by turning the outgoing pipe 32 in the U shape, the portion turned in the U shape is displaced following the movement of the upper stage 10 in the X-axis direction. The outgoing pipe 32 that has passed the support 11 is connected to a joint 12 fixed to the X table 1. As a result, the cooling water supplied from the thermostatic water bath is supplied to the heat exchanger 17 of the X table 1 via the joint 31, the outgoing pipe 32, and the joint 12. As a result, the X table 1 in contact with the surface of the heat exchanger 17 through which the cooling water passes is cooled.

The cooling water used for cooling the X table 1 is supplied from a joint 13 fixed to the X table 1 to a heat exchanger 27 of the Y table 2 via the transition pipe 33. The transition pipe 33 is supported by the support 11. The transition pipe 33 supported by the support 11 is disposed along the X-axis direction, turns into a U shape, and then disposed along the X-axis direction. The transition pipe 33 is connected to a joint 22 fixed to the Y table 2. As a result, the cooling water cooled in the X table 1 is supplied to the heat exchanger 27 of the Y table 2 via the joint 13, the transition pipe 33, and the joint 22. As a result, the Y table 2 in contact with the surface of the heat exchanger 27 through which the cooling water passes is cooled.

The cooling water used for cooling the Y table 2 returns from a joint 23 fixed to the Y table 2 to the thermostatic water bath through the return pipe 34. The return pipe 34 is supported by the support 21. The return pipe 34 supported by the support 21 is disposed along the Y-axis direction, turns in a U shape, and then disposed along the Y-axis direction. The return pipe 34 is connected to the joint 35 of the thermostatic water bath. The cooling water cooled in the thermostatic water bath is supplied to the joint 31 again.

The outgoing pipe 32 and the transition pipe 33 are connected to a surface 16 perpendicular to the Y-axis direction of the upper stage 10. The transition pipe 33 and the return pipe 34 are connected to a surface 28 perpendicular to the Y-axis direction of the lower stage 20. The vertical surface 16 of the upper stage 10 to which the outgoing pipe 32 and the transition pipe 33 are connected and the vertical surface 28 of the lower stage 20 to which the transition pipe 33 and the return pipe 34 are connected are surfaces on the same side. The vertical surface 16 of the upper stage 10 to which the outgoing pipe 32 and the transition pipe 33 are connected and the vertical surface 28 of the lower stage 20 to which the transition pipe 33 and the return pipe 34 are connected may be surfaces on different sides. For example, the outgoing pipe 32 and the transition pipe 33 may be connected to a surface 18 perpendicular to the X-axis direction of the upper stage 10, and the transition pipe 33 and the return pipe 34 may be connected to the surface 28 perpendicular to the Y-axis direction of the lower stage 20.

(Inclination Angle of Upper Stage 10)

The control device 50 measures the inclination angle of the upper stage 10 and controls the upper stage 10 to be horizontal. The Y table 2 has a vertical surface 24 perpendicular to the Y-axis direction, and a linear scale 25 (see FIG. 3) is attached to the vertical surface 24. The X table 1 has a vertical surface 14 perpendicular to the Y-axis direction, and a sensor 15 (see FIG. 3) that reads the linear scale 25 is attached to the vertical surface 14. When the linear scale 25 is read by the sensor 15 facing the vertical surface 24 and the vertical surface 14, the height of the X table 1 with respect to the Y table 2 can be measured (Z displacement measurement). The linear scale 25 has, for example, a plate shape in which a pattern for reflecting laser beam is formed by a fine lattice, and is used in combination with the sensor 15 that emits laser beam and reads reflected light. If the reflection pattern formed on the linear scale 25 is two-dimensional, not only the amount of displacement of the relative position between the linear scale 25 and the sensor 15 in the Z-axis direction but also the amount of displacement in the X-axis direction can be measured. Further, when height measurement is performed on one linear scale by two sensors, the inclination angle of the X table 1 can be obtained from the difference between the heights of the two points. That is, it is possible to measure the pitching angle of the X table 1 moving in the X-axis direction. Using this principle, when the number of sets of the linear scale 25 and the sensor 15 is further increased by 2, it is possible to measure the yawing angle and the rolling angle. This makes it possible to perform highly accurate inclination angle measurement with a simple configuration.

(Heat Exchanger)

FIG. 2 is a cross-sectional view taken along line S1-S2 in FIG. 1. A structure for cooling the X table 1 and the Y table 2 will be specifically described with reference to FIG. 2. The X table 1 is made of aluminum alloy. The X table 1 includes the heat exchanger 17 formed of a stainless pipe therein, and the heat exchanger 17 is a cooling unit that cools the X table 1 with a refrigerant. The heat exchanger 17 built in the X table 1 cools the X table 1 by bringing the surface of a pipe through which a refrigerant (for example, cooling water) passes into contact with the X table 1. The pipe constituting the heat exchanger 17 is formed by bending one pipe, and one pipe has an inlet and an outlet for cooling water. A mechanism for floating the upper stage 10 from the Y table 2, a mechanism for moving the upper stage 10 in the X-axis direction, a mechanism for moving the upper stage 10 in the Y-axis direction, and the like are attached to the X table 1. These mechanisms serve as heat sources and conduct heat to the X table 1. Since the X table 1 is formed of an aluminum alloy, a temperature gradient accompanying thermal conduction is reduced, and a temperature rise and temperature unevenness can be reduced.

Similarly, the Y table 2 is also formed of an aluminum alloy. The Y table 2 also has the heat exchanger 27 formed of a stainless pipe therein. The heat exchanger 27 is a cooling unit that cools the Y table 2 with a refrigerant. The heat exchanger 27 incorporated in the Y table 2 cools the Y table 2 by bringing the surface of a pipe through which the refrigerant passes into contact with the Y table 2. The pipe constituting the heat exchanger 27 is also formed by bending one pipe, and one pipe has an inlet and an outlet for cooling water. A mechanism for floating the upper stage 10 from the Y table 2, a mechanism for moving the lower stage 20 in the Y-axis direction, and the like are attached to the Y table 2. The mechanism serves as a heat source and conducts heat to the Y table 2. Since the Y table 2 is also formed of an aluminum alloy, a temperature gradient associated with thermal conduction is reduced, and a temperature rise and temperature unevenness can be reduced.

(Guide Rail 5 and Slide Unit 26)

The lower stage 20 centered on the Y table 2 is restrained by the two guide rails 5 so as not to be movable in a direction other than the Y-axis direction. The guide rail 5 is fixed to a sample chamber 40. The lower stage 20 includes slide units 26 arranged at four corners of the lower stage 20, and the slide units 26 come into contact with the guide rails 5. A rolling element is disposed inside the slide unit 26, and this rolling element makes contact with the guide rail 5 into rolling contact. As a result, the slide unit 26 and the guide rail 5 form a contact structure with low friction and no play.

When the temperature of the Y table 2 rises, the movement of the Y table 2 in the Y-axis direction is not restricted, so that the Y table 2 freely expands in the Y-axis direction. On the other hand, since the movement in the direction other than the Y-axis direction is restricted by the guide rail. 5, the Y table 2 cannot expand in the direction other than the Y-axis direction. Therefore, the expansion due to the temperature rise is absorbed by the Y table 2 being curved in a mountain shape. That is, when the Y table 2 is curved in a mountain shape, the Y table 2 is lowered to the right on the right side of FIG. 2, and the Y table 2 is lowered to the left on the left side of FIG. 2. On the other hand, the X table 1 moves to the positive side or the negative side of the X coordinate. When the X table 1 moves, the inclination angle of the X table 1 is measured with reference to the Y table 2 at the position of the movement destination.

(Control Device 50)

The control device 50 controls a stage drive mechanism 60 to move the lower stage 20 in the Y-axis direction, move the upper stage 10 in the Y-axis direction and the X-axis direction, and change the inclination of the upper stage 10. The stage drive mechanism 60 includes a mechanism for floating the upper stage 10 from the Y table 2, a mechanism for moving the upper stage 10 in the X-axis direction, a mechanism for moving the upper stage 10 in the Y-axis direction, and a mechanism for moving the lower stage 20 in the Y-axis direction. The control device 50 of the first embodiment measures the inclination angle of the X table 1, and controls the inclination of the X table 1 so that the X table 1 becomes horizontal based on the measured inclination angle.

The control device 50 controls the inclination of the upper stage 10 with reference to the Y table 2 of the lower stage 20 cooled by the heat exchanger 27. Specifically, the control device 50 measures the position of the upper stage 10 at a plurality of places with reference to the vertical surface 24 provided on the Y table 2, and controls the inclination of the upper stage 10 on the basis of the measurement result.

The control device 50 measures the XY coordinates of the X table 1 of the upper stage 10 based on the laser beam reflected by the X mirror 3 and the Y mirror 4. Then, the control device 50 controls the movement of the upper stage 10 and the lower stage 20 based on the XY coordinates of the X table 1 to move the sample placed on the upper stage 10 to a desired position.

Figure 3:
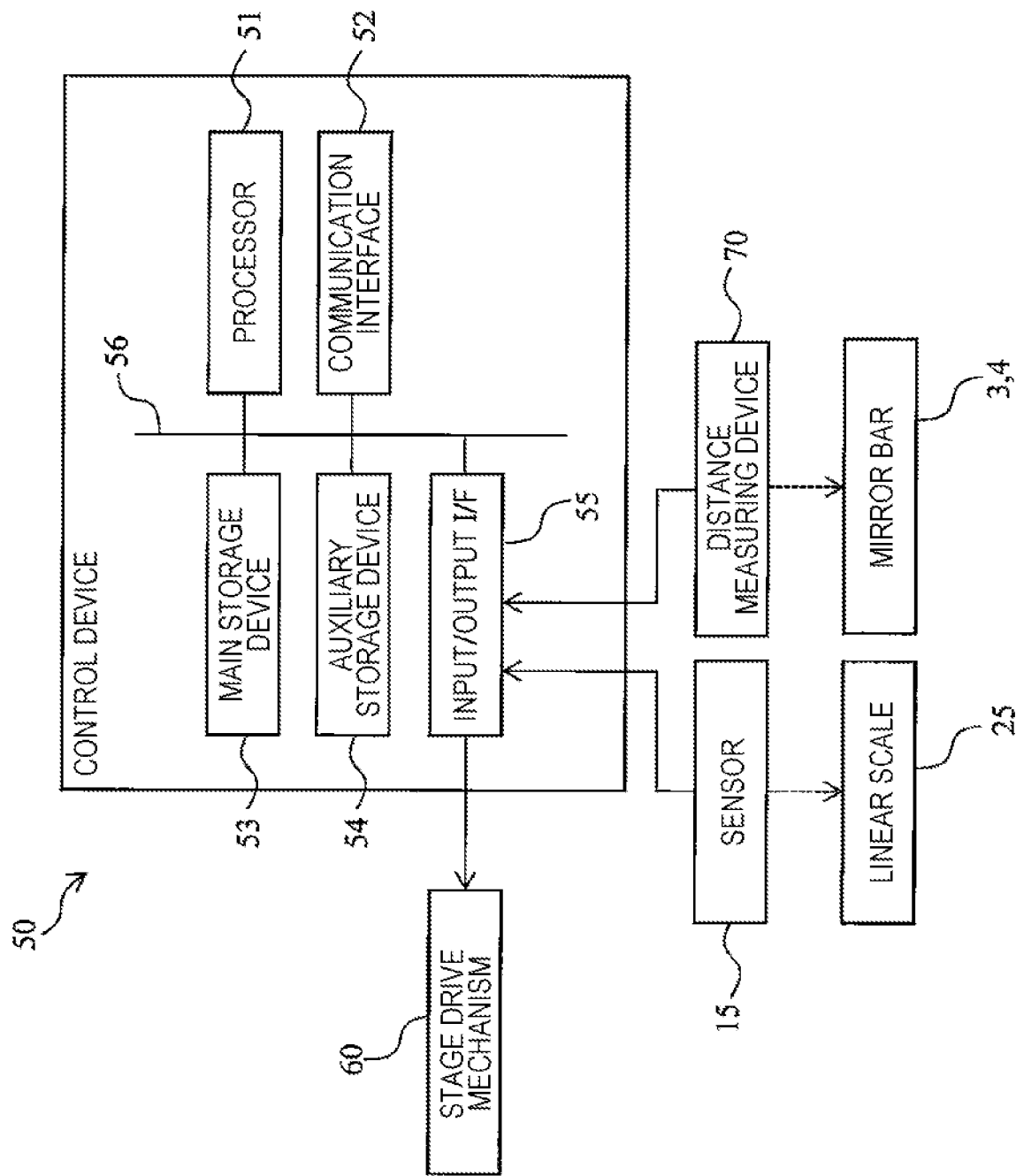
FIG. 3 is a diagram illustrating a control device of the stage apparatus according to the first embodiment.

Next, a hardware configuration of the control device 50 will be described with reference to FIG. 3. The control device 50 includes a processor 51, a communication interface 52 (Hereinafter, the interface is abbreviated as an I/F), a main storage device 53, an auxiliary storage device 54, an input/output I/F 55, and a bus 56 that communicably connects the above-described modules.

The processor 51 is a central processing unit that controls the operation of each unit of the stage apparatus 100. The processor 51 is, for example, a central processing unit (CPU), a digital signal processor (DSP), an application specific integrated circuit (ASIC), or the like. The processor 51 develops the program stored in the auxiliary storage device 54 in a work area of the main storage device 53 in an executable manner. The main storage device 53 stores a program executed by the processor 51, data processed by the processor, and the like. The main storage device 53 is a flash memory random access memory (RAM), a read only memory (ROM), or the like. The auxiliary storage device 54 stores various programs and various data. The auxiliary storage device 54 stores, for example, an operating system (OS), various programs, various tables, and the like. The auxiliary storage device 54 is a silicon disk including a nonvolatile semiconductor memory (flash memory, EPROM (Erasable Programmable ROM)), a solid state drive device, a hard disk (HDD, Hard Disk Drive) device, or the like.

The communication I/F 52 is an interface for communicably connecting the stage apparatus 100 to the outside via a network. The measurement result of the sensor 15 connected to the input/output I/F 55 and the measurement result of a distance measuring device 70 are input to the input/output I/F 55. The distance measuring device 70 is a laser interferometer type distance measuring device, and irradiates the reflecting surfaces of the X mirror 3 and the Y mirror 4 with laser beam. The processor 51 calculates the inclination angle of the X table 1 based on the measurement result of the sensor 15, and controls the stage drive mechanism 60 so that the X table 1 becomes horizontal based on the calculated inclination angle of the X table 1. The processor 51 measures the XY coordinates of the X table 1 and the XY coordinates of the sample placed on the X table 1 based on the measurement result of the distance measuring device 70. The input/output I/F 55 outputs a drive instruction to the stage drive mechanism 60 connected to the input/output I/F 55. The stage drive mechanism 60 moves the lower stage 20 in the Y-axis direction, moves the upper stage 10 in the Y-axis direction and the X-axis direction, and changes the inclination angle of the upper stage 10 in accordance with a drive instruction from the control device 50.

Effects of First Embodiment

The control device 50 can accurately level the upper stage 10 by controlling the inclination of the upper stage 10 with reference to the Y table 2 cooled by the heat exchanger 27. In the first embodiment, since the movement of the Y table 2 in a direction other than the Y-axis direction is restricted by the guide rail. 5, the Y table 2 is thermally expanded and curved in a mountain shape unless the Y table 2 is cooled. Even if the X table 1 is controlled to be horizontal with reference to the Y table 2 due to the curvature of the Y table 2 serving as a reference for calculating the inclination angle of the X table 1, the X table 1 does not actually become horizontal. Therefore, in the first embodiment, by cooling the Y table 2, the curvature of the Y table 2 as a reference can be suppressed, and the X table 1 can be controlled to be horizontal with high accuracy. As a result, it is possible to accurately maintain the XY plane, which is the XY coordinate of the sample, and the horizontal of the upper stage 10 in parallel. In a case where the height of the plane for measuring the position coordinates of the upper stage 10 and the height of the plane of the position coordinates of the sample coincide with each other, even if there is a slight angular deviation between both heights, an error in the coordinates can be reduced. However, if there is a difference between the heights, a coordinate error occurs by an amount proportional to a product of the height difference and the angular difference. In the first embodiment, by accurately leveling the upper stage 10, the angular deviation is reduced, the above-described coordinate error is reduced, and the positioning accuracy of the sample is improved.

In the first embodiment, the cooling water used for cooling the X table 1 of the upper stage 10 is used for cooling the Y table 2 of the lower stage 20, so that the two tables can be cooled with the common cooling water.

In the first embodiment, by floating the upper stage 10 from the lower stage 20 by magnetic force, it is possible to prevent the influence of the thermal expansion of the lower stage 20 from being directly transmitted to the upper stage 10.

In the first embodiment, the inclination of the upper stage 10 can be calculated with a simple configuration by measuring the position of the upper stage 10 at a plurality of places with reference to the vertical surface 24 provided on the Y table 2 of the lower stage 20. In the first embodiment, the inclination of the upper stage 10 can be calculated with a simple configuration by attaching the linear scale 25 to the vertical surface 24 and attaching the sensor 15 that reads the linear scale 25 to the vertical surface 14.

In the first embodiment, the outgoing pipe 32 is disposed along the Y-axis direction, turned around, and then disposed along the Y-axis direction. By displacing the U-turned portion with the movement of the Y table 2 in the Y-axis direction, the refrigerant can be supplied to the Y table 2 even if the lower stage 20 moves. Similarly, the outgoing pipe 32 is disposed along the X-axis direction, turned around, and then disposed along the X-axis direction, and the U-turned portion is displaced along with the movement of the X table 1 in the X-axis direction, whereby the refrigerant can be supplied to the X table 1 even if the upper stage 10 moves.

In the first embodiment, the outgoing pipe 32 and the transition pipe 33 are connected to the surface 16 of the X table 1 perpendicular to the Y-axis direction, and the pipe 33 and the return pipe 34 are connected to the surface 28 of the Y table 2 perpendicular to the Y-axis direction. As described above, since the pipes can be connected to the vertical surfaces on the same side of the X table 1 and the Y table 2, the pipes can be easily connected. The connection surface of the pipe may be appropriately selected in consideration of preventing vibration associated with circulation of the cooling water.

In the first embodiment, the heat exchanger 17 obtained by bending one pipe is provided inside the X table 1, and the heat exchanger 27 obtained by bending one pipe is provided inside the Y table 2, whereby the X table 1 and the Y table 2 can be efficiently cooled.

In the first embodiment, the lower stage 20 is a guide rail type, but may be a floating type stage. In a case where the lower stage 20 is a floating stage, there is no restriction of movement by the guide rail 5, and thermal deformation associated therewith does not occur. However, thermal deformation may occur due to mixing of components of various materials in the configuration of the stage apparatus 100. When materials having different linear expansion coefficients are connected, a curve is generated such that a part having a larger elongation due to a temperature rise is located outside a curvature radius and a part having a smaller elongation is located inside the curvature radius. Therefore, even if the lower stage 20 is a floating stage, it is possible to accurately level the X table 1 by suppressing the thermal expansion of the Y table 2 as a reference.

In the first embodiment, the single-stroke cooling water pipe 30 is configured to cool both the X table 1 and the Y table 2, but each of the X table 1 and the Y table 2 may be cooled by branching the cooling water pipe 30. The cooling water that has branched and cooled each table is returned to a the joint pipe. In a portion where the pipes merge, flow vibration is likely to occur. The configuration of the single-stroke cooling water pipe 30 of the first embodiment has an effect of preventing vibration due to the flow of cooling water. When the pipe vibrates, the vibration is transmitted to the upper stage 10 and the lower stage 20, but vibration prevention by eliminating the joint pipe leads to vibration prevention of the X table 1 and the Y table 2.

It is also possible to provide independent cooling water pipes 30 in the upper stage 10 and the lower stage 20. However, the upper stage 10 moves in the X-axis direction and also moves in the Y-axis direction following the lower stage 20. Therefore, the cooling water pipe 30 of the upper stage 10 needs a U-shaped turn for following the movement of the lower stage 20 and a U-shaped turn for following the movement of the upper stage 10. Since the lower stage 20 moves in the Y-axis direction, the cooling water pipe 30 of the lower stage 20 requires a U-shaped turn for following the lower stage 20. That is, when the independent cooling water pipe 30 is provided in each of the upper stage 10 and the lower stage 20, the overlapping cooling water pipe 30 is required. Therefore, the single-stroke cooling water pipe 30 has an effect of reducing the pipe amount.

In the single-stroke cooling water pipe 30, when one of the X table 1 and the Y table 2 is cooled with the cooling water, the temperature of the cooling water increases by the amount of heat received therein, and the other cooling effect decreases. Therefore, in the single-stroke cooling water pipe 30, the cooling effect becomes larger when the cooling water is supplied first. In the first embodiment, by first supplying the cooling water to the upper stage 10, the X table 1 can be effectively cooled.

Second Embodiment

Figure 4:
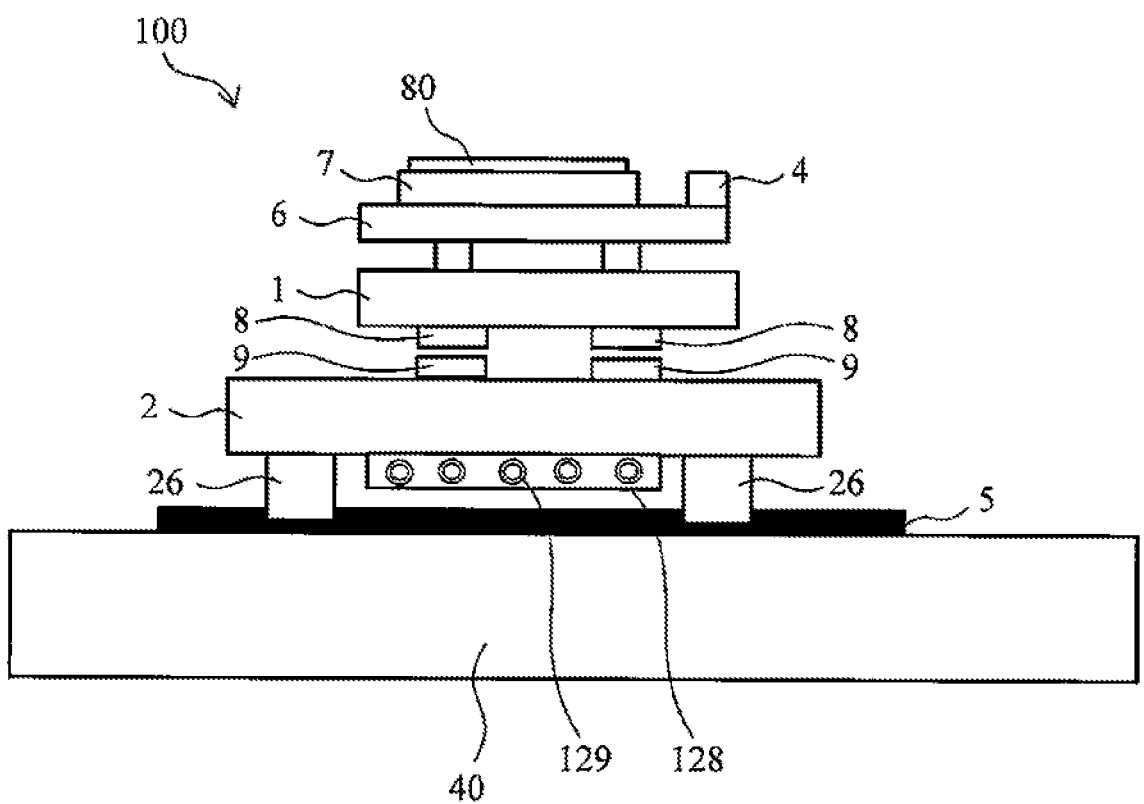
FIG. 4 is a diagram illustrating an overall configuration of a stage apparatus of a second embodiment.

FIG. 4 is a cross-sectional view of a stage apparatus according to a second embodiment. FIG. 4 is a cross-sectional view of the stage apparatus 100 according to the second embodiment taken along a plane perpendicular to the X axis. The same components as those of the first embodiment are denoted by the same reference numerals as those of the first embodiment, and the description thereof will be omitted. In the second embodiment, as a configuration for cooling the Y table 2, the heat exchanger 27 is not embedded inside the Y table 2, but an external heat sink 128 is attached to the lower stage 20. The heat sink 128 has a flow path 129 for allowing a refrigerant to flow therein. The heat sink 128 of the second embodiment may be a heat sink that does not allow the refrigerant to flow, or may have a plurality of fins so as to increase the surface area.

A stainless pipe may be embedded in the heat sink 128 to form the flow path 129, or a base material of the heat sink 128 may be grooved and covered to form the flow path 129.

In FIG. 4, the configuration of the upper stage 10 is described more specifically than in the first embodiment. The upper stage 10 includes the X table 1, the X mirror 3 (see FIG. 1) and the Y mirror 4 described in the first embodiment, a top table 6, a chuck 7, and a coil 8.

The coil 8 of the Z motor is attached to the X table 1. A yoke 9 paired with the Z motor is installed on the Y table 2. The Z motor applies a force in the Z direction (=floating force) to the upper stage 10, and includes the coil 8 through which a current flows and the yoke 9 made of a magnetic material. Since the Z motor may have a small movable range, the yoke 9 may be configured using a permanent magnet or a magnetic body such as iron that is not magnetic. When a permanent magnet is used, an attractive force and a repulsive force can be generated between the coil 8 and the yoke 9 of the magnet. However, when the yoke 9 made of a magnetic material not having magnetism is used, only attractive force is generated. Therefore, when the yoke 9 made of a magnetic material not having magnetism is used, the yoke 9 is disposed on the upper side and the coil 8 is disposed on the lower side. As a result, the coil. 8 floats to a desired height by controlling the balance between the downward force due to gravity applied to the coil 8 and the upward force due to the attractive force of the magnetic force.

The coils 8 are disposed at four corners of the X table 1. The four coils 8 are independently controlled by the control device 50. The control device 50 controls the flying height, the pitching angle, and the rolling angle of the upper stage 10. Since the upper stage 10 moves greatly in the X-axis direction, the yoke 9 that is stationary with respect to the moving coil 8 needs to generate similar electromagnetic force at any position. If the yoke 9 is made of only a magnetic material and has a shape extending in the depth direction of the paper surface of FIG. 4, the relationship between the coil 8 and the yoke 9 is the same even if the upper stage 10 moves in the X-axis direction. Therefore, while there are four coils 8, there are two yokes 9. That is, two coils 8 correspond to one yoke 9. The X table 1 includes a linear motor that applies thrust in the X-axis direction and a mechanism for following the movement of the lower stage 20 in the Y-axis direction, but the configuration thereof is omitted in FIG. 4.

In the second embodiment, the X mirror 3, the Y mirror 4, and the chuck 7 are installed on the top table 6. The chuck 7 is for mounting a sample 80 such as a semiconductor wafer. Since it is difficult to directly measure the position of the sample 80 when the sample 80 is used, the positions of the reflecting surfaces of the X mirror 3 and the Y mirror 4 are measured to measure the XY coordinates of the sample 80. Therefore, it is important to prevent the positional relationship between the X mirror 3 and the Y mirror 4 and the sample 80 from changing. Therefore, the chuck 7 is made of a material that is hardly thermally deformed, or the X mirror 3 and the Y mirror 4 are installed on the top table 6. The top table 6 has an integral structure with the X table 1, but has a structure in which columns are placed between the top table 6 and the X table 1 so as to reduce the influence of deformation generated in the X table 1 on the positions and angles of the X mirror 3 and the Y mirror 4. The configuration of the upper stage 10 of the second embodiment is also applicable to the upper stage 10 of the first embodiment.

Effect of Second Embodiment

Since various components such as a mechanism for moving the lower stage 20 in the Y-axis direction are attached to the Y table 2, the lower stage 20 has a complicated shape. By preparing the heat sink 128 separates from the lower stage 20 having such a complicated shape, it is possible to prevent the lower stage 20 from becoming complicated. The lower stage 20 is easily manufactured, and the manufacturing accuracy of the lower stage 20 is improved.

Other effects are the same as those of the first embodiment, and thus the description thereof will be omitted.

Third Embodiment

Figure 5:
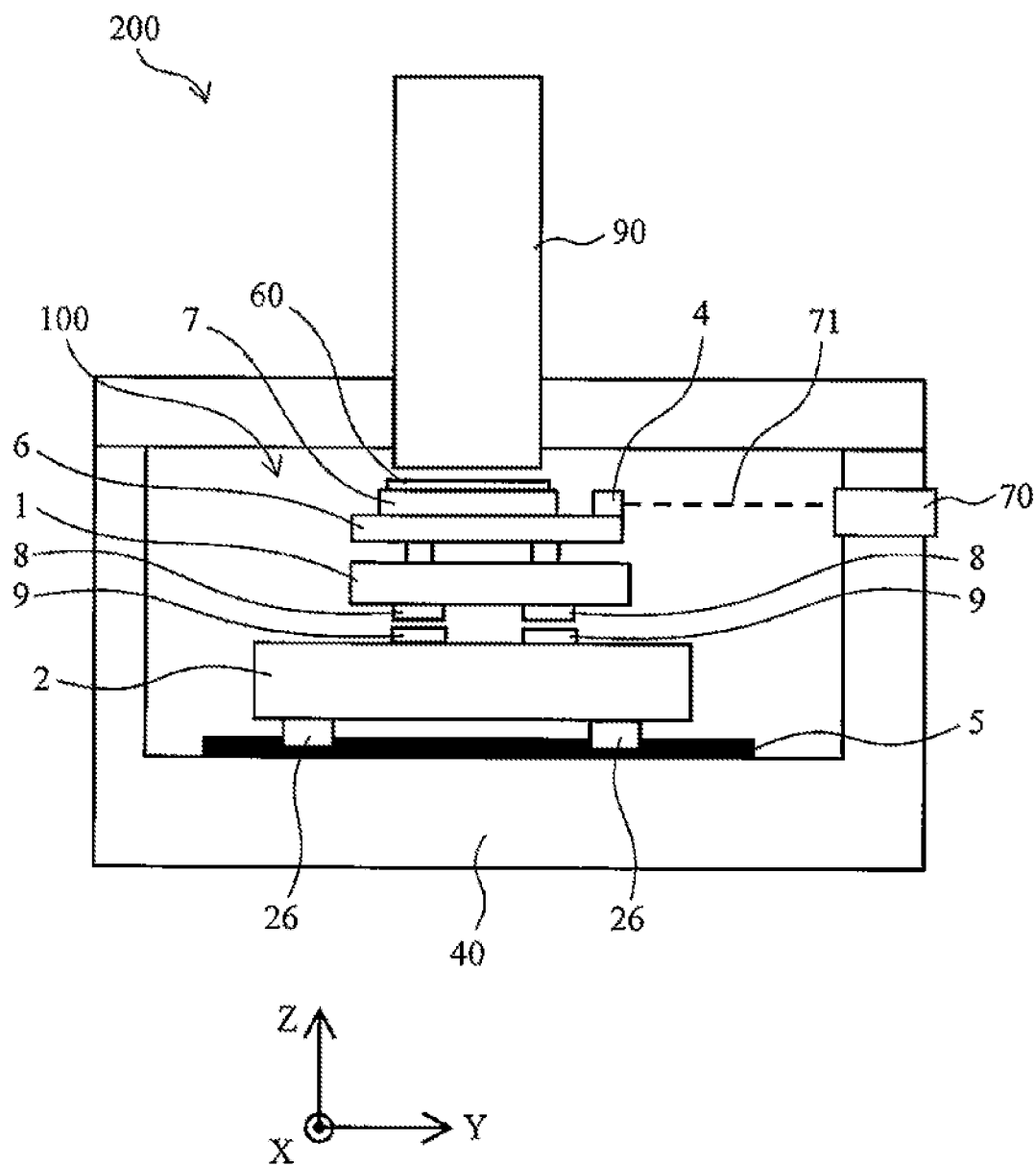
FIG. 5 is a diagram illustrating an overall configuration of a charged particle beam apparatus of a third embodiment.

FIG. 5 is a configuration diagram of a charged particle beam apparatus according to a third embodiment. A charged particle beam apparatus 200 includes a stage apparatus 100 therein. The stage apparatus 100 inside the charged particle beam apparatus 200 is the stage apparatus 100 described in the first embodiment or the second embodiment. The charged particle beam apparatus 200 includes an electron microscope that applies an electron beam to the sample 80 such as a semiconductor wafer to be observed to enlarge an image. The electron microscope includes an electron optical system lens barrel 90, the stage apparatus 100, a sample chamber 40, and a distance measuring device 70.

The electron optical system lens barrel 90 has a charged particle source, and the sample 80 is irradiated with a beam emitted from the charged particle source. When the beam (electron beam) is applied to the sample 80, the sample 80 is placed in a vacuum environment in order to avoid scattering due to gas molecules. Therefore, the sample chamber 40 has a function of a vacuum chamber. Although the cooling water pipe 30 is not illustrated in FIG. 5, the cooling water pipe 30 illustrated in FIG. 1 is installed in the sample chamber 40. The stage apparatus 100 moves the chuck 7 on which the sample 80 is mounted in the X-axis direction and the Y-axis direction. FIG. 5 is a cross section taken along a plane perpendicular to the X-axis direction, and thus illustrates a cross section of the Y mirror 4. The Y mirror 4 is a right vertical reflecting surface in the drawing, and the distance measuring device 70 irradiates the reflecting surface with a laser beam 71 to measure the Y coordinate of the Y mirror 4. The distance measuring device 70 is a laser interferometer type distance measuring device. The distance measuring device 70 is fixed to the sample chamber 40. Although not illustrated in FIG. 5, the X mirror 3 and the distance measuring device 70 that irradiates the reflecting surface of the X mirror 3 with laser beam and measures the X coordinate of the X mirror 3 are provided at a position rotated by 90°. The XY coordinates of the sample 80 placed on the stage apparatus 100 are calculated based on the Y coordinate of the Y mirror 4 and the X coordinate of the X mirror 3.

The electron optical system lens barrel 90 is fixed to the sample chamber 40. Since observing the sample with the electron microscope is observation at a high magnification, the distance between the electron microscope and the sample 80 cannot be increased. Therefore, the distance between the electron optical system lens barrel 90 and the sample 80 is small. On the other hand, the X mirror 3 and the Y mirror 4 on the upper stage 10 may come directly below the electron optical system lens barrel 90 along with the operation of the upper stage 10. In order to prevent contact with the X mirror 3 and the Y mirror 4 in the electron optical system lens barrel 90, the uppermost portions of the X mirror 3 and the Y mirror 4 needs to be lower than the lowermost portion of the electron optical system lens barrel 90. Therefore, the uppermost portions of the X mirror 3 and the Y mirror 4 cannot be made significantly higher than the sample 80. The reflecting surfaces of the X mirror 3 and the Y mirror 4 are not usable up to the uppermost part of the vertical surface, and the perpendicularity is secured up to a portion slightly away from the ridge line which forms the corner. For this reason, the laser beam 71 emitted by the distance measuring device 70 of the laser interferometer type has to be positioned lower than the upper surface of the sample 80. As a result, the height of the plane of the XY coordinates where the position of the upper stage 10 is measured (the height of the laser beam 71) becomes lower than the upper surface of the sample 80. What the stage apparatus 100 wants to position is the position irradiated with the electron beam on the upper surface of the sample 80, and is the XY coordinates on the upper surface of the sample 80.

One of the principles of distance measurement is the Abbe principle, and when distance measurement is performed on parallel lines, an error increases as compared with distance measurement performed on an extension line of two points to be measured. Measuring the XY coordinates of the upper stage 10 on a plane having a height deviated from the upper surface of the sample 80 is similar to the condition in which the error indicated by the Abbe principle increases. It is explained that the factor of the error expansion indicated by the Abbe principle is that the measurement target and the axis of the actual measurement point are not completely parallel. Therefore, when both are brought close to perfect parallel, the measurement error also decreases. When this principle is used, it is considered that positioning accuracy of the sample is improved if the upper stage 10 can be brought close to perfect horizontal.

In order to keep the floating upper stage 10 horizontal, it is necessary to grasp the inclination angle of the upper stage 10 and control the upper stage 10 to be horizontal based on the inclination angle. As the actuator for control, Z motors (coils 8) installed at the four corners of the upper stage 10 can be used. Regarding the measurement of the inclination angle of the upper stage 10, when the method used in the description of the first embodiment is used, simple and accurate measurement can be performed. As a result, when the measurement accuracy of the inclination angle of the upper stage 10 is improved, the accuracy of the control for keeping the upper stage 10 horizontal is improved, and the positioning accuracy of the sample is improved.

Effect of Third Embodiment

Since the effect of the charged particle beam apparatus 200 of a third embodiment is similar to that of the first embodiment, the description thereof will be omitted.

The present invention is not limited to the above embodiments, and various modifications may be contained. The above-described embodiments have been described in detail for clear understanding of the present invention, and are not necessarily limited to those having all the described configurations. Some of the configurations of a certain embodiment may be replaced with the configurations of the other embodiments, and the configurations of the other embodiments may also be added to the configurations of the subject embodiment. For some of the configurations of each embodiment, other configurations may be added omitted, or replaced.

In the first embodiment, both the X table 1 and the Y table 2 are cooled, but only the Y table 2 may be cooled. In the first embodiment, the cooling is performed in the order of the X table 1 and the Y table 2, but the cooling may be performed in the order of the Y table 2 and the X table 1.

The floating upper stage 10 of the first to third embodiments may be of a type including an electromagnet that applies buoyancy to the upper stage 10 and a linear motor that applies thrust in a uniaxial direction, or may be of a type including a shaft motor that has both functions of floating and propulsion as one.

The upper stage 10 of the first to third embodiments is a magnetic floating type that floats using electromagnetic force, but may be an air bearing type that floats using pressure of gas.

What is claimed is:

1. A stage apparatus comprising:
   a first stage configured to move in a first direction;
   a second stage configured to float from the first stage and move in a second direction orthogonal to at least the first direction;
   a first cooling unit configured to cool a table of the first stage with a refrigerant; and
   a control device configured to control an inclination of the second stage with reference to the table of the first stage cooled by the first cooling unit.

2. The stage apparatus according to claim 1, further comprising:
   a second cooling unit configured to cool a table of the second stage with the refrigerant, wherein
   the refrigerant used for cooling one of the tables of the first stage and the second stage is also used for cooling an other one of the tables of the first stage and the second stage.

3. The stage apparatus according to claim 2, wherein the refrigerant is used for cooling the table of the second stage and then used for cooling the table of the first stage.

4. The stage apparatus according to claim 3, further comprising:
   a first refrigerant pipe configured to supply the refrigerant to the second cooling unit; and
   a second refrigerant pipe configured to supply the refrigerant supplied to the second cooling unit from the second cooling unit to the first cooling unit.

5. The stage apparatus according to claim 1, wherein the second stage floats by magnetic force with respect to the first stage.

6. The stage apparatus according to claim 1, wherein the first stage moves in the first direction on a guide rail disposed along the first direction.

7. The stage apparatus according to claim 1, wherein the control device measures positions of the second stage at a plurality of places with reference to a vertical surface provided on the table of the first stage, and controls the inclination of the second stage based on a measurement result.

8. The stage apparatus according to claim 7, further comprising:
   a linear scale attached to one of the vertical surface of the first stage and an opposing surface facing the vertical surface of the second stage; and
   a sensor that is attached to the vertical surface and an other side of the opposing surface and reads the linear scale, wherein
   the control device controls the inclination of the second stage based on a measurement result of the sensor.

9. The stage apparatus according to claim 1, further comprising:
   a mirror bar provided on a table of the second stage, wherein
   position coordinates of the second stage are measured based on a laser beam reflected by the mirror bar, and
   the control device controls a position of the first stage or the second stage based on the position coordinates.

10. The stage apparatus according to claim 1, further comprising:
    a refrigerant pipe configured to supply the refrigerant to the first cooling unit, wherein
    the refrigerant pipe is disposed along the first direction, is disposed along the first direction after making a U-turn, and displaces a portion where the U-turn is made as the first stage moves in the first direction.

11. The stage apparatus according to claim 1, further comprising:
    a refrigerant pipe configured to supply the refrigerant to the first cooling unit, wherein
    the refrigerant pipe is connected to a surface of the first stage perpendicular to the first direction.

12. The stage apparatus according to claim 1, wherein the first cooling unit includes one pipe built in the table of the first stage and having an inlet and an outlet for the refrigerant.

13. The stage apparatus according to claim 1, wherein the first cooling unit includes a heat sink attached to the table of the first stage and having a flow path for the refrigerant.

14. A charged particle beam apparatus comprising:
    a charged particle source;
    a chuck on which a sample irradiated with a beam emitted from the charged particle source is mounted;
    the stage apparatus according to claim 1, configured to move the chuck; and
    a vacuum chamber in which the stage apparatus is installed.

* * * * *